(12) United States Patent
Ito et al.

(10) Patent No.: US 9,428,827 B2
(45) Date of Patent: Aug. 30, 2016

(54) METHOD OF MANUFACTURING ELECTRICALLY CONDUCTIVE MAYENITE COMPOUND WITH HIGH ELECTRON DENSITY

(71) Applicant: Asahi Glass Company, Limited, Tokyo (JP)

(72) Inventors: Kazuhiro Ito, Tokyo (JP); Satoru Watanabe, Tokyo (JP); Toshinari Watanabe, Tokyo (JP); Naomichi Miyakawa, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 14/659,851

(22) Filed: Mar. 17, 2015

(65) Prior Publication Data

US 2015/0184281 A1   Jul. 2, 2015

Related U.S. Application Data

(63) Continuation of application No. PCT/JP2013/075929, filed on Sep. 25, 2013.

(30) Foreign Application Priority Data

Sep. 28, 2012   (JP) ................................. 2012-217343

(51) Int. Cl.
  *C04B 35/44* (2006.01)
  *C23C 14/34* (2006.01)
  (Continued)

(52) U.S. Cl.
  CPC ........... *C23C 14/3414* (2013.01); *C01F 7/002* (2013.01); *C01F 7/164* (2013.01); *C04B 35/117* (2013.01); *C04B 35/44* (2013.01); *C01P 2004/61* (2013.01); *C01P 2006/40* (2013.01);
  (Continued)

(58) Field of Classification Search
  CPC ....................... C04B 35/44; C04B 2235/6587
  See application file for complete search history.

(56) References Cited

U.S. PATENT DOCUMENTS 8,304,974 B2   11/2012   Watanabe et al.
8,377,413 B2    2/2013   Ito et al.
(Continued)

FOREIGN PATENT DOCUMENTS

JP   2010-132467   6/2010
JP   2012-25636    2/2012
(Continued)

OTHER PUBLICATIONS

International Search Report issued in International Application No. PCT/JP2013/075929, dated Oct. 29, 2013.
(Continued)

*Primary Examiner* — Erin Snelting
(74) *Attorney, Agent, or Firm* — Oblon, McClelland, Maier & Neustadt, L.L.P.

(57) ABSTRACT

A method of manufacturing an electrically conductive mayenite compound, includes (a) preparing a body to be processed, the body to be processed including a mayenite compound or a precursor of a mayenite compound; and (b) performing a heat treatment on the body to be processed under a reducing atmosphere including an aluminum compound and carbon monoxide (CO) gas within a range of 1080° C. to 1450° C., the aluminum compound being a compound that emits aluminum oxide gas during the heat treatment on the body to be processed.

14 Claims, 3 Drawing Sheets

(51) Int. Cl.
*C01F 7/00* (2006.01)
*C01F 7/16* (2006.01)
*C04B 35/117* (2006.01)

(52) U.S. Cl.
CPC .. *C04B2235/3208* (2013.01); *C04B 2235/445* (2013.01); *C04B 2235/6587* (2013.01); *C04B 2235/664* (2013.01)

(56) References Cited

U.S. PATENT DOCUMENTS

| 8,454,930 B2 | 6/2013 | Ito et al. |
| 2006/0151311 A1 | 7/2006 | Hosono et al. |
| 2008/0089826 A1 | 4/2008 | Hosono et al. |
| 2008/0095688 A1* | 4/2008 | Hosono ............... C01F 7/164 423/263 |
| 2011/0182803 A1 | 7/2011 | Ito et al. |
| 2014/0061551 A1 | 3/2014 | Ito et al. |
| 2015/0136593 A1 | 5/2015 | Ito et al. |

FOREIGN PATENT DOCUMENTS

| JP | 2012-126618 | 7/2012 |
| WO | WO 2005/000741 A1 | 1/2005 |
| WO | WO 2006/129674 A1 | 12/2006 |
| WO | WO 2010/041558 A1 | 4/2010 |
| WO | WO 2012/157461 A1 | 11/2012 |
| WO | WO 2013/094346 A1 | 6/2013 |

OTHER PUBLICATIONS

F.M. Lea, et al; The Chemistry of Cement and Concrete, $2^{nd}$ ed., p. 52; Edward Arnold & Co., London; 1956.
U.S. Appl. No. 14/659,866, filed Mar. 17, 2015, Ito, et al.
U.S. Appl. No. 14/567,478, filed Dec. 11, 2014, Ito, et al.

* cited by examiner

METHOD OF MANUFACTURING ELECTRICALLY CONDUCTIVE MAYENITE COMPOUND WITH HIGH ELECTRON DENSITY

CROSS-REFERENCE TO RELATED APPLICATION

This application is a continuation application filed under 35 U.S.C. 111(a) claiming the benefit under 35 U.S.C. 120 and 365(c) of PCT International Application No. PCT/JP2013/075929 filed on Sep. 25, 2013, which is based upon and claims the benefit of priority of Japanese Priority Application No. 2012-217343 filed on Sep. 28, 2012, the entire contents of which are hereby incorporated by reference.

BACKGROUND OF THE INVENTION

1. Field of the Invention

The present invention relates to a method of manufacturing an electrically conductive mayenite compound with a high electron density.

2. Description of the Related Art

A mayenite compound has a typical composition expressed as $12CaO.7Al_2O_3$, and has a characteristic crystalline structure including three-dimensionally connected cages, each having a diameter about 0.4 nm. A skeletal structure structuring the cages is positively charged, and forms twelve cages per unit lattice. Oxygen ions occupy ⅙ of the cages in order to satisfy an electrical neutrality condition of the crystal. However, the oxygen ions inside the cages have a chemical characteristic different from the oxygen ions composing the skeletal structure. Thus, the oxygen ions inside the cages are specifically referred to as "free oxygen ions". The mayenite compound is also expressed as $Ca_{24}Al_{28}O_{64}]^{4+}.2O^{2-}$ (Non-Patent Document 1).

When a part of or all of the free oxygen ions inside the cages of the mayenite compound are substituted for by electrons, the mayenite compound is provided with an electrical conductivity. This is because, the electrons included in the cages of the mayenite compound can freely move in the crystal without being tied by the respective cages (Patent Document 1). Such a mayenite compound with the electrical conductivity is referred to, in particular, as an "electrically conductive mayenite compound".

Such an electrically conductive mayenite compound may be manufactured by, for example, a method of putting a mayenite compound powder in a carbon container with a cover and performing a heat treatment at 1300° C. under a nitrogen gas atmosphere (Patent Document 2). Hereinafter, this method is referred tows a "conventional method 1".

Further, such an electrically conductive mayenite compound may be manufactured by a method of putting a object to be processed composed of a mayenite compound in an alumina container with a cover with metal aluminum and performing a heat treatment at 1300° C. in vacuum (Patent Document 2). Hereinafter, this method is referred to as a "conventional method 2".

PATENT DOCUMENTS

Patent Document 1] WO 2005/000741
Patent Document 2] WO 2006/129674

Non-Patent Document

Non-Patent Document 1] F. M. Lea, C. H. Desch, The Chemistry of Cement and Concrete, 2nd ed., p. 52, Edward Arnold & Co., London, 1956

However, according to the above described conventional method 1, there is a problem in that it is difficult to obtain an electrically conductive mayenite compound with a sufficiently high electron density. The electron density of the electrically conductive mayenite compound obtained by the conventional method 1 is less than $3\times10^{20}$ cm$^{-3}$.

The present inventors have found that, when an electrically conductive mayenite compound is used for a target for depositing a thin film in a vapor deposition method, for example, the electron density of a thin film that is formed by the target has a correlation with the electron density of the electrically conductive mayenite compound of the target. Thus, it is necessary to make the electron density of the electrically conductive mayenite compound used in the target be higher in order to increase the electron density of the thin film.

On the other hand, according to the above described conventional method 2, an electrically conductive mayenite compound with a high electron density more than $1\times10^{21}$ cm$^{-3}$ can be obtained. However, by this method, it is necessary to heat a body to be processed while being in contact with metal aluminum. The present inventors have found the following problem for this case.

As the melting point of metal aluminum is 660° C., if the body to be processed and metal aluminum are heated at a temperature higher than or equal to the melting point, liquid aluminum is formed at a surface of the object to be processed. When the temperature of the body to be processed is lowered to room temperature under this state, a body of metal aluminum that is generated by solidification of liquid is adhered to the surface of the formed electrically conductive mayenite compound. Such an adhered body strongly bonds to the electrically conductive mayenite compound and it is not easy to peel or remove the adhered body. In order to collect the electrically conductive mayenite compound, it is necessary to break a container or the like that is used in the heat treatment with a hammer, and carefully remove aluminum that is adhered around the electrically conductive mayenite compound using a power saw, a ceramics Leutor and sand paper. In particular, when assuming that the electrically conductive mayenite compound is used as a relatively large product such as a target for depositing a thin film in a vapor deposition, for example, it is extremely unrealistic to easily collect the electrically conductive mayenite compound from the container or the like that is used in the heat treatment. Thus, if such a phenomenon occurs, an additional process step is required when collecting the electrically conductive mayenite compound, which lacks productivity.

SUMMARY OF THE INVENTION

The present invention is made in light of the above problems, and provides a method of effectively manufacturing an electrically conductive mayenite compound with a high electron density.

According to one aspect, there is provided a method of manufacturing an electrically conductive mayenite compound, including (a) preparing a body to be processed, the body to be processed including a mayenite compound or a precursor of a mayenite compound; and (b) performing a heat treatment on the body to be processed under a reducing atmosphere including an aluminum compound and carbon monoxide (CO) gas within a range of 1080° C. to 1450° C., the aluminum compound being a compound that emits aluminum oxide gas during the heat treatment on the body to be processed.

According to the embodiment, it is possible to provide a method of effectively manufacturing an electrically conductive mayenite compound with a high electron density.

DETAILED DESCRIPTION OF THE PREFERRED EMBODIMENTS

Figure 1:
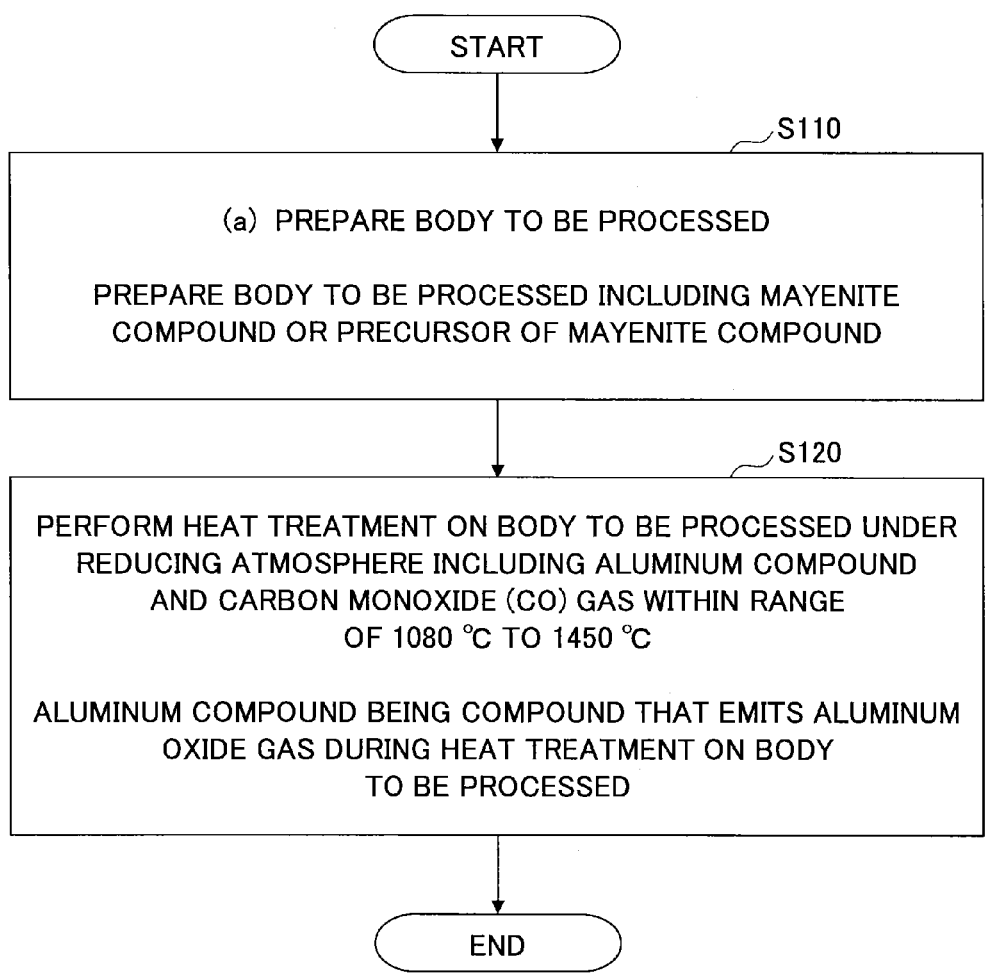
FIG. 1 is a flowchart schematically illustrating an example of a method of manufacturing an electrically conductive mayenite compound of an embodiment.

In the embodiment, there is provided a method of manufacturing an electrically conductive mayenite compound, including
(a) a step of preparing a body to be processed, the body to be processed including a mayenite compound or a precursor of a mayenite compound, and
(b) a step of performing a heat treatment on the body to be processed under a reducing atmosphere including an aluminum compound and carbon monoxide (CO) gas within a range of 1080° C. to 1450° C., the aluminum compound being a compound that emits aluminum oxide gas during the heat treatment on the body to be processed.

Here, in this embodiment, the "mayenite compound" is a generic name of $12CaO \cdot 7Al_2O_3$ (hereinafter, referred to as "C12A7") that has a cage structure and a compound (an isomorphous compound) having a similar crystalline structure as C12A7. As the isomorphous compound of C12A7, $12SrO \cdot 7Al_2O_3$ is known.

Further, in this embodiment, an "electrically conductive mayenite compound" means a mayenite compound in which a part of or all of the "free oxygen ions" included in the cages are substituted for by electrons and having an electron density of greater than or equal to $1.0 \times 10^{18}$ cm$^{-3}$. Further, in particular, the mayenite compound whose electron density is greater than or equal to $3.0 \times 10^{20}$ cm$^{-3}$ is referred to as an "electrically conductive mayenite compound with a high electron density". The electron density is about $2.3 \times 10^{21}$ cm$^{-3}$ when all of the free oxygen ions are substituted for by electrons.

Thus, the "mayenite compound" includes the "electrically conductive mayenite compound" and a "non-electrically conductive mayenite compound".

According to the embodiment, the electron density of the manufactured "electrically conductive mayenite compound" is, preferably, greater than or equal to $3.0 \times 10^{20}$ cm$^{-3}$ and the "electrically conductive mayenite compound with a high electron density" having a significantly higher electron density compared with the conventional method using a carbon container with a cover can be obtained. The electron density of the electrically conductive mayenite compound manufactured in the embodiment is preferably greater than or equal to $5.0 \times 10^{20}$ cm$^{-3}$, more preferably, greater than or equal to $7.0 \times 10^{20}$ cm$^{-3}$, and furthermore preferably, greater than or equal to $1.0 \times 10^{21}$ cm$^{-3}$.

Here, generally, the electron density of the electrically conductive mayenite compound is measured by one of two methods based on the electron density of the mayenite compound. When the electron density is $1.0 \times 10^{18}$ cm$^{-3}$ to less than $3.0 \times 10^{20}$ cm$^{-3}$, diffuse reflection of the electrically conductive mayenite compound powder is measured, the diffuse reflection is performed with Kubelka-Munk transformation to obtain absorption spectra, and the electron density is calculated from the absorbance (Kubelka-Munk transformation value) at 2.8 eV (wavelength 443 nm) of the obtained absorption spectra. This method is based on the fact that the electron density and the Kubelka-Munk transformation value have a linear relationship. Hereinafter, a method of creating a calibration curve is explained.

First, four samples having different electron densities are prepared and electron densities of the four samples are obtained from signal strengths of electron spin resonance (ESR). The electron density capable of being measured by ESR is about $1.0 \times 10^{14}$ cm$^{-3}$ to $1.0 \times 10^{19}$ cm$^{-3}$. Logarithms of the Kubelka-Munk values and electron densities obtained by ESR are plotted to obtain a linear relationship and the obtained linear line was used as the calibration curve. It means that in this method, when the electron density is $1.0 \times 10^{19}$ cm$^{-3}$ to $3.0 \times 10^{20}$ cm$^{-3}$, the calibration curve is obtained by extrapolation.

When the electron density is $3.0 \times 10^{20}$ cm$^{-3}$ to $2.3 \times 10^{21}$ cm$^{-3}$, diffuse reflection of the electrically conductive mayenite compound powder is measured, the diffuse reflection is processed with Kubelka-Munk transformation to obtain absorption spectra, and the electron density is obtained by a conversion using a wavelength (energy) of a peak of the absorption spectra. The following relationship was used.

$$n = (-(E_{sp} - 2.83)/0.199)^{0.782} \quad (1)$$

Here, "n" indicates the electron density (cm$^{-3}$), and "$E_{sp}$" indicates energy (eV) of the peak of the absorption spectra obtained by Kubelka-Munk transformation.

In the application, for the electrically conductive mayenite compound, a part of at least one kind of atom selected from calcium (Ca), aluminum (Al) and oxygen (O) may be substituted for by another atom or an atom group as long as the electrically conductive mayenite compound has a C12A7 crystalline structure composed of calcium (Ca), aluminum (Al) and oxygen (O). For example, a part of calcium (Ca) may be substituted for by one or more atom(s) selected from a group consisting of magnesium (Mg), strontium (Sr), barium (Ba), lithium (Li), sodium (Na), chromium (Cr), manganese (Mn), cerium (Ce), cobalt (Co), nickel (Ni) and copper (Cu). Further, a part of aluminum (Al) may be substituted for by one or more atom(s) selected from a group consisting of silicon (Si), germanium (Ge), boron (B), gallium (Ga), titanium (Ti), manganese (Mn), iron (Fe), cerium (Ce), praseodymium (Pr), scandium (Sc), lanthanum (La), yttrium (Y), europium (Eu), ytterbium (Yb), cobalt (Co), nickel (Ni) and terbium (Tb). Further, the oxygen of the skeletal structure of the cages may be substituted for by nitrogen (N) or the like.

According to the embodiment, at least a part of free oxygen ions in the cases of the electrically conductive mayenite compound may be substituted for by anions such as H$^-$, H$_2^-$, H$^{2-}$, O$^-$, O$_2^-$, OH$^-$, F$^-$, Cl$^-$, S$^{2-}$ or the like, or anions of nitrogen (N).

The ratio of calcium (Ca) and aluminum (Al) in the electrically conductive mayenite compound of the embodiment, based on molar ratio as converted to CaO:Al$_2$O$_3$, is preferably within a range of 10:9 to 13:6, more preferably, within a range of 11:8 to 12.5:6.5, furthermore preferably, within a range of 11.5:7.5 to 12.3:6.7, yet furthermore preferably, within a range of 11.8:7.2 to 12.2:6.8 and particularly preferably, about 12:7. When a part of calcium (Ca) is substituted for by another atom, the number of moles of calcium and the other atom is assumed as the number of moles of calcium. When a part of aluminum (Al) is substituted for by another atom, the number of moles of aluminum and the other atom is assumed as the number of moles of aluminum.

Here, it can be considered that the reasons that an "electrically conductive mayenite compound with a high electron density" is manufactured when using a method of manufacturing of the embodiment are as follows.

First, according to the method of manufacturing of the embodiment, the body to be processed including the mayenite compound is prepared, for example.

Further, according to the method of manufacturing of the embodiment, such a body to be processed is subjected to a heat treatment under a reducing atmosphere with the existence of an aluminum compound that emits aluminum oxide gas when being performed with the heat treatment and carbon monoxide (CO) gas.

Here, for the aluminum oxide gas, AlO gas and/or $Al_2O$ gas may be used. The aluminum oxide gas has a strong reducing effect. Thus, the environment to which the body to be processed is exposed becomes a strong reducing atmosphere. Thus, when the aluminum oxide gas is generated during the heat treatment, the mayenite compound, that is the body to be processed, is reduced by the gas and oxygen ions in the cages of the mayenite compound are substituted for by electrons.

For example, when assuming aluminum carbide ($Al_4C_3$) as the aluminum compound that emits the aluminum oxide gas, aluminum carbide emits the aluminum oxide gas in the environment during the heat treatment on the body to be processed by the following reactions.

$$Al_4C_3 + 2O_2 \rightarrow 4AlO + 3C \quad (2)$$

$$Al_4C_3 + O_2 \rightarrow 2Al_2O + 3C \quad (3)$$

Due to the reducing effect of the emitted aluminum oxide gas, oxygen ions in the cages of the mayenite compound are substituted for by electrons by the following reactions.

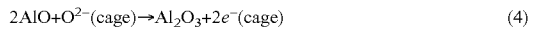

$$2AlO + O^{2-}(\text{cage}) \rightarrow Al_2O_3 + 2e^-(\text{cage}) \quad (4)$$

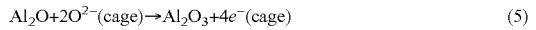

$$Al_2O + 2O^{2-}(\text{cage}) \rightarrow Al_2O_3 + 4e^-(\text{cage}) \quad (5)$$

Thus, it is considered that the mayenite compound, that is the body to be processed, is reduced by such reactions and an electrically conductive mayenite compound with a high electron density is generated.

Further, the carbon monoxide gas (CO) has a function to suppress deposition of oxide on a surface of the mayenite compound. In other words, with the existence of the carbon monoxide gas, not only oxide, but also carbide is also generated at the surface of the mayenite compound. The carbide has a bad compatibility with the mayenite compound, that is oxide, and also is not sintered at the heat process temperature. Thus, as the aluminum oxide gas can easily reach the surface of the mayenite compound, the reducing effect of formulas (4) and (5) easily proceeds compared with an environment where the carbon monoxide gas does not exist.

In particular, according to the method of manufacturing of the embodiment, the electron density of the manufactured electrically conductive mayenite compound is greater than or equal to $3.0 \times 10^{20}$ cm$^{-3}$ and the "electrically conductive mayenite compound with a high electron density" having a significantly higher electron density compared with the conventional method 1 using a carbon container with a cover can be obtained.

Further, according to the method of manufacturing of the present invention, different from the above described conventional method 2, metal aluminum is not used.

As described above, in the conventional method 2 in which metal aluminum is used, if the electrically conductive mayenite compound and metal aluminum are heated to a temperature higher than or equal to the melting point, liquid aluminum is formed at a surface of the object to be processed. When the temperature of the body to be processed is lowered to room temperature under this state, a body of metal aluminum is adhered to the surface of the formed electrically conductive mayenite compound. Such an adhered body strongly bonds to the electrically conductive mayenite compound and it is not easy to peel or remove the adhered body. Thus, if such a phenomenon occurs, an additional process step is required when collecting the electrically conductive mayenite compound, which lacks productivity.

On the other hand, according to the method of manufacturing of the embodiment, an aluminum compound that emits aluminum oxide gas is used and metal aluminum is not used at the heat treatment. As is clear from the above described equations (2) and (3), although the aluminum compound is altered to solid carbon (C) during the heat treatment, the aluminum compound does not generate a liquid component in the course of the reaction.

Thus, according to the method of manufacturing of the embodiment, the phenomenon that the body of metal aluminum or the like is adhered to the surface of the formed electrically conductive mayenite compound with a high electron density can be significantly prevented. Thus, according to the method of manufacturing of the embodiment, the electrically conductive mayenite compound with a high electron density that is generated after the heat treatment can be easily collected.

As such, according to the method of manufacturing, it is possible to manufacture the electrically conductive mayenite compound with a high electron density without lowering productivity.

(Example of Method of Manufacturing Electrically Conductive Mayenite Compound With High Electron Density of Embodiment)

An example of a method of manufacturing of the embodiment is explained in detail with reference to drawings.

FIG. 1 illustrates an example of the method of manufacturing the electrically conductive mayenite compound with a high electron density of the embodiment.

As illustrated in FIG. 1, the method of manufacturing of the embodiment includes, (a) a step of preparing a body to be processed, the body to be processed including a mayenite compound or a precursor of a mayenite compound (step S110), and (b) a step of performing a heat treatment on the body to be processed under a reducing atmosphere including an aluminum compound and carbon monoxide (CO) gas within a range of 1080° C. to 1450° C., the aluminum compound being a compound that emits aluminum oxide gas during the heat treatment on the body to be processed (step S120).

Each of the steps is explained in detail in the following.

(Step S110)

First, a body to be processed is prepared. The body to be processed includes a mayenite compound or a precursor of a mayenite compound. For example, the body to be processed may be (i) a compact body of a mayenite compound powder,
(ii) a sintered body of a mayenite compound, or
(iii) a compact body of a calcinated powder including calcium and aluminum.

Hereinafter, a method of preparing the body to be processed of each of (i) to (iii) is explained.

(i) Method of Preparing Compact Body of Mayenite Compound Powder (Preparation of Mayenite Compound Powder)

When preparing a compact body of a mayenite compound powder, first, a raw material powder is prepared.

The raw material powder is prepared such that the ratio of calcium (Ca) and aluminum (Al) becomes within a range of 10:9 to 13:6 based on molar ratio as converted to CaO:$Al_2O_3$. It is preferable that CaO:$Al_2O_3$ (molar ratio) is within a range of 11:8 to 12.5:6.5, more preferably, within a range of 11.5:7.5 to 12.3:6.7, furthermore preferably, within a range of 11.8:7.2 to 12.2:6.8 and particularly preferably, about 12:7.

Here, the compound used for the raw material powder is not specifically limited as long as the ratio is held.

It is preferable that the raw material powder includes calcium aluminate, or at least two compounds selected from a group consisting of a calcium compound, an aluminum compound and calcium aluminate.

The raw material powder may be the following mixed powder, for example, such as a mixed powder including a calcium compound and an aluminum compound, a mixed powder including a calcium compound and calcium aluminate, a mixed powder including an aluminum compound and calcium aluminate, a mixed powder including a calcium compound, an aluminum compound and calcium aluminate, or a mixed powder including only calcium aluminate.

For the calcium compound, calcium carbonate, calcium oxide, calcium hydroxide, calcium hydrogencarbonate, calcium sulfate, calcium metaphosphate, calcium oxalate, calcium acetate, calcium nitrate, calcium halide or the like may be used. Among these, calcium carbonate, calcium oxide, and calcium hydroxide are preferably used.

For the aluminum compound, aluminum hydroxide, aluminum oxide, aluminum sulfate, aluminum nitrate, aluminum halide or the like may be used. Among these, aluminum hydroxide and aluminum oxide are preferably used. For aluminum oxide (alumina), although there are α-alumina, γ-alumina, δ-alumina and the like, α-aluminum oxide (alumina) is preferably used.

For calcium aluminate, $CaO.Al_2O_3$, $3CaO.Al_2O_3$, $5CaO.3Al_2O_3$, $CaO.2Al_2O_3$, $CaO.6Al_2O_3$ or the like is preferably used. C12A7 may be used by mixing with the calcium compound or the aluminum compound.

The raw material powder may further include a fluorine (F) component. For the fluorine (F) component, for example, calcium fluoride ($CaF_2$) or the like is used. When the fluorine (F) component is added in the raw material powder, finally (after step S120), an electrically conductive mayenite compound with a high electron density or the like in which fluorine ions are introduced in cages can be manufactured.

The raw material powder including the fluorine (F) component may be prepared, although not limited so, for example, by adding calcium fluoride to the mixed powder of the calcium compound and the aluminum compound as described above.

The content of fluorine (F) in the raw material powder is not specifically limited. The content of fluorine (F) may be selected such that "x" is within a range of 0 to 0.60, for example, when the chemical formula of the finally obtainable electrically conductive mayenite compound is expressed as follows.

$(12-x)CaO.7Al_2O_3.xCaF_2$      (6)

Next, the raw material powder prepared as described above is held at a high temperature and the mayenite compound is synthesized.

The synthesizing may be performed under an inert-gas atmosphere or in vacuum; but preferably, the synthesizing may be performed in air. The synthesizing temperature is not specifically limited; but, for example, is within a range of 1150° C. to 1460° C., and preferably, within a range of 1200° C. to 1415° C., more preferably, within a range of 1250° C. to 1400° C. and furthermore preferably, within a range of 1300° C. to 1350° C. When it is synthesized within a temperature range of 1150° C. to 1460° C., the mayenite compound including a large amount of a C12A7 crystalline structure can be easily obtained. When the synthesizing temperature is too low, there is a possibility that the amount of the C12A7 crystalline structure becomes small. On the other hand, when the synthesizing temperature is too high to exceed the melting point of the mayenite compound, there is a possibility that the amount of the C12A7 crystalline structure becomes small.

For the mayenite compound that does not include fluorine, it is more preferable that the synthesizing temperature is 1230 C. to 1415 C., more preferably, 1250 C. to 1380 C. and particularly preferably, 1280 C. to 1350° C. For the mayenite compound that includes fluorine, it is more preferable that the synthesizing temperature is 1180 C. to 1420 C., more preferably, 1200 C. to 1400 C. and particularly preferably, 1230 C. to 1380° C. As the mayenite compound including fluorine has a high melting point, the range of the synthesizing temperature becomes wide and the compound is easy to be manufactured.

The high temperature holding time is not specifically limited, and this varies in accordance with a synthesizing amount, holding temperature or the like. The holding time is, for example, 1 hour to 12 hours. The holding time is, for example, preferably, 2 hours to 10 hours, and more preferably, 4 hours to 8 hours. By holding the raw material powder at a high temperature for more than or equal to 1 hour, a solid phase reaction proceeds sufficiently to obtain a uniform mayenite compound.

The mayenite compound obtained by the synthesizing has a block-like structure in which a part or all is sintered. The block-like mayenite compound is processed with a milling process by a stamping mill or the like, for example, to be a size about 5 mm. Further, the mayenite compound may be processed with a milling process by an automatic mortar or a dry ball mill to form particles having an average particle size of about 10 μm to 100 μm. Here, the "average particle size" means a value obtained by a measurement using a laser diffraction/scattering method. Hereinafter, the average particle size of the powder means the measured value by a similar method.

When further fine and uniform particles are to be obtained, for example, the average particle size of the powder can be refined to 0.5 μm to 50 μm by using a wet ball mill in which alcohol (for example, isopropyl alcohol)

expressed as $C_nH_{2n+1}OH$ ("n" is integer more than or equal to 3) is used as solvent, or a circular bead mill or the like.

The mayenite compound powder is prepared by the above step.

The mayenite compound prepared as a powder may be an electrically conductive mayenite compound. This is because the electrically conductive mayenite compound has a better pulverizability than a non-electrically conductive compound.

A synthesizing method of the electrically conductive mayenite compound is not specifically limited, but the following methods may be used. For example, a method of manufacturing by putting a mayenite compound in a carbon container with a cover and performing a heat treatment at 1600° C. (WO 2005/000741), a method of manufacturing by putting a mayenite compound in a carbon container with a cover and performing a heat treatment at 1300° C. in nitrogen (WO 2006/129674), a method of manufacturing by putting a powder such as calcium aluminate or the like made from a calcium carbonate powder and an aluminum oxide powder in a carbon crucible with a cover and performing a heat treatment at 1300° C. in nitrogen (WO 2010/041558), a method of manufacturing a powder obtained by mixing a calcium carbonate powder and an aluminum oxide powder in a carbon crucible with a cover and performing a heat treatment at 1300° C. in nitrogen (Japanese Laid-open Patent Publication 2010-132467) or the like may be used.

A method of grinding the electrically conductive mayenite compound is similar to the method of grinding the mayenite compound.

With the above steps, the electrically conductive mayenite compound powder is prepared. Here, a mixed powder of a non-mayenite compound and the electrically conductive mayenite compound may be used. (Preparation of compact body of mayenite compound powder) Next, a compact body including the mayenite compound powder prepared by the method as described above is prepared. The compact body may be prepared by pressing a molding material including a powder or a kneaded body including a powder. The compact body may be obtained by pressing, sheet forming, extrusion molding or injection molding of the molding material. The shape of the compact body is not specifically limited.

(ii) Preparation of Sintered Body of Mayenite Compound

Even when preparing the sintered body of the mayenite compound, a part of the method explained in the above described "(i) Method of preparing compact body of mayenite compound powder" may be used.

For example, by the method explained in the above described "(Preparation of mayenite compound powder)", the raw material powder is held at a high temperature and the mayenite compound is synthesized. The block-like mayenite compound obtained after this synthesizing may be used as a sintered body for the body to be processed as it is.

Alternatively, a sintered body obtained by heat-processing the compact body explained in "(Preparation of compact body of mayenite compound powder)" of "(i) Method of preparing compact body of mayenite compound powder" may be used as the body to be processed.

For the latter case, the heat process condition is not specifically limited as long as the compact body is sintered. The heat treatment may be performed, for example, in air at a temperature range of 300 C. to 1450° C. When the temperature is greater than or equal to 300 C., the sintering process can easily proceed as the organic component is volatilized and contacting points of the powder increase, and when the temperature is less than or equal to 1450 C., it is easy to retain the shape of the sintered body. The maximum temperature of the heat treatment is in about range of 1000 C. to 1420 C., preferably, 1050 C. to 1415 C., furthermore preferably, 1100 C. to 1380 C. and particularly preferably, 1250 C. to 1350° C.

The holding time at the maximum temperature in the heat treatment is within a range of about 1 hour to 50 hours, preferably, 2 hours to 40 hours, and furthermore preferably, 3 hours to 30 hours. Further, although even when the holding time is longer, there is no problem in characteristics of the obtained sintered body, it is preferable that the holding time is within 48 hours in a viewpoint of manufacturing cost. The heat treatment may be performed in inert-gas such as argon, helium, neon, nitrogen or the like, in oxygen gas, in an atmosphere of mixture thereof, or in vacuum.

In addition to this, the sintered body of the mayenite compound may be prepared by various methods.

Here, the mayenite compound included in the sintered body may be the electrically conductive mayenite compound or the non-electrically conductive mayenite compound. Further, the mayenite compound included in the sintered body may be the mayenite compound including fluorine or the mayenite compound that does not include fluorine.

(iii) Preparation Method of Compact Body of Calcinated Powder

In this embodiment, the "calcinated powder" means a powder prepared through a heat treatment and (i) a mixed powder including at least two selected from a group consisting of calcium oxide, aluminum oxide and calcium aluminate, or (ii) a mixed powder of two or more kinds of calcium aluminate. For calcium aluminate, $CaO.Al_2O_3$, $3CaO.Al_2O_3$, $5CaO.3Al_2O_3$, $CaO.2Al_2O_3$, $CaO.6Al_2O_3$, C12A7 or the like may be used. The ratio of calcium (Ca) and aluminum (Al) in the "calcinated powder" is 9.5:9.5 to 13:6, based on molar ratio as converted to $CaO:Al_2O_3$.

In particular, the ratio of calcium (Ca) and aluminum (Al) is adjusted to be within a range of 10:9 to 13:6, based on molar ratio as converted to $CaO:Al_2O_3$. $CaO:Al_2O_3$ (molar ratio) is preferably within a range of 11:8 to 12.5:6.5, more preferably, within a range of 11.5:7.5 to 12.3:6.7, furthermore preferably, within a range of 11.8:7.2 to 12.2:6.8, and particularly preferably about 12:7.

The calcinated powder is also referred to as a "precursor" of a mayenite compound.

(Preparation of Calcinated Powder)

The calcinated powder can be prepared as follows. First, a raw material powder is prepared. The raw material powder includes at least a raw material that becomes a calcium oxide source and an aluminum oxide source.

For example, it is preferable that the raw material powder includes two or more kinds of calcium aluminate, or at least two compounds selected from a group consisting of a calcium compound, an aluminum compound and calcium aluminate.

The raw material powder may be, for example, the following raw material powder: a raw material powder including the calcium compound and the aluminum compound, a raw material powder including the calcium compound and calcium aluminate, a raw material powder including the aluminum compound and calcium aluminate, a raw material powder including the calcium compound, the aluminum compound and calcium aluminate, or a raw material powder including only calcium aluminate.

Hereinafter, a method of preparing the calcinated powder is explained while assuming that the raw material powder includes at least a raw material "A" that becomes the calcium oxide source and a raw material "B" that becomes the aluminum oxide source, as a representative.

For the raw material "A", calcium carbonate, calcium oxide, calcium hydroxide, calcium hydrogencarbonate, calcium sulfate, calcium metaphosphate, calcium oxalate, calcium acetate, calcium nitrate, calcium halide or the like may be used. Among these, calcium carbonate, calcium oxide, and calcium hydroxide are preferably used.

For the raw material "B", aluminum hydroxide, aluminum oxide, aluminum sulfate, aluminum nitrate, aluminum halide or the like may be used. Among these, aluminum hydroxide and aluminum oxide are preferably used. For aluminum oxide (alumina), although there are α-alumina, γ-alumina, δ-alumina and the like, α-aluminum oxide (alumina) is preferably used.

The calcinated powder may include a material other than the raw material "A" and the raw material "B". The calcinated powder may include a fluorine component or may not include a fluorine component.

Next, the raw material powder including the raw material "A" and the raw material "B" is processed with a heat treatment. With this, the calcinated powder including calcium and aluminum is obtained. As described above, the ratio of calcium (Ca) and aluminum (Al) in the calcinated powder, based on molar ratio as converted to $CaO:Al_2O_3$, is within a range of about 10:9 to 13:6.

The maximum temperature of the heat treatment is within a range about 600° C. to 1250° C., preferably, within a range of 900° C. to 1200° C., and more preferably, within a range of 1000° C. to 1100° C. The holding time at the maximum temperature in the heat treatment is within a range of about 1 hour to 50 hours, preferably, within a range of 2 hours to 40 hours, and more preferably, within a range of 3 hours to 30 hours. Further, although there is no problem in characteristics even when the holding time is longer, it is preferable that the holding time is within 48 hours in a viewpoint of manufacturing cost.

The heat treatment may be performed in air. The heat treatment may be performed in inert-gas such as argon, helium, neon, nitrogen or the like, in oxygen gas, in an atmosphere of mixture thereof, or in vacuum.

The calcinated powder obtained after the heat treatment is generally in a block form in which a part of or the entirety of is sintered. Thus, in accordance with necessity, a milling process (rough milling and/or fine milling) as described in the above (Preparation of mayenite compound powder) may be performed.

With the above steps, the calcinated powder is prepared.
(Preparation of Compact Body of Calcinated Powder)

Next, a compact body is formed using the calcinated powder prepared as described above.

For the method of forming the compact body, a method same as that explained above in (Preparation of compact body of mayenite compound powder) regarding the preparation of (i) can be used and it is not repeated.

With the above steps, the compact body of the calcinated powder is prepared.

Here, the explanation of the above described (i) to (iii) of preparing the body to be processed is just an example, and it should be apparent for those skilled in the art to prepare the body to be processed using other methods. For example, the body to be processed may be a compact body of a mixed powder obtained by mixing the mayenite compound powder and the calcinated powder.
(Step S120)

Next, a heat treatment is performed using the body to be processed such as (i) to (iii) prepared by the above described method of preparation.

The heat treatment of the body to be processed is performed under a reducing atmosphere including carbon monoxide (CO) gas. The "reducing atmosphere" is a generic name for an atmosphere in which the partial pressure of oxygen in the environment is less than or equal to $10^{-3}$ Pa, and the environment may be an inert-gas atmosphere, or a reduced pressure environment (vacuum environment whose pressure is less than or equal to 100 Pa, for example). The partial pressure of oxygen is, preferably, less than or equal to $10^{-5}$ Pa, more preferably, less than or equal to $10^{-10}$ Pa, and furthermore preferably, less than or equal to $10^{-15}$ Pa.

The carbon monoxide gas may be provided from outside to the environment where the body to be processed is placed, but a container containing carbon may be used, for example, and the body to be processed may be placed in the container containing carbon. At this time, the carbon monoxide gas is provided from the container containing carbon when the body to be processed is subjected to the heat treatment. Alternatively, another member that can be a CO source may be used.

A method of adjusting the environment to a reducing atmosphere when performing the high temperature treatment on the body to be processed is not specifically limited.

For example, the container containing carbon may be placed at a vacuum atmosphere whose pressure is less than or equal to 100 Pa. In this case, the pressure is, preferably, less than or equal to 60 Pa, more preferably, less than or equal to 40 Pa, and furthermore preferably, less than or equal to 20 Pa.

Alternatively, an inert-gas atmosphere (however, except nitrogen gas) in which partial pressure of oxygen is less than or equal to 1000 Pa may be supplied to the container containing carbon. At this time, the partial pressure of oxygen in the supplied inert-gas atmosphere is, preferably, less than or equal to 100 Pa, more preferably, less than or equal to 10 Pa, furthermore preferably, less than or equal to 1 Pa, and particularly preferably, less than or equal to 0.1 Pa.

The inert-gas atmosphere may be an argon gas atmosphere or the like.

Here, it should be noted that an aluminum compound is provided in an environment to which the body to be processed is exposed during the heat treatment in this embodiment. The aluminum compound is not specifically limited as long as it can emit aluminum oxide gas during the heat treatment. The aluminum compound may be, for example aluminum carbide ($Al_4C_3$) or the like.

The heat process temperature is within a range of 1080 C. to 1450° C. If the heat process temperature is less than 1080° C., there is a possibility that sufficient electrical conductivity is not given to the mayenite compound. Further, if the heat process temperature is more than 1450° C., which exceeds the melting point of the mayenite compound, the crystalline structure decomposes to lower the electron density.

For the body to be processed that does not include the fluorine component, it is preferable that the heat process temperature is 1230 C. to 1415 C., more preferably, 1250 C. to 1380 C., and furthermore preferably, 1280° C. to 1350° C. It is preferable to perform the heat treatment at less than or equal to 1380° C. as it is easier to obtain an electrically conductive mayenite compound with a desired shape. Further, it is more preferable to perform the heat treatment at less than or equal to 1350° C. for stability of the shape. For the body to be processed including the fluorine component, it is preferable that the heat process temperature is 1180° C. to 1420 C., more preferably, 1200° C. to 1400° C., and furthermore preferably, 1230 C. to 1380° C. When the body to be processed includes the fluorine component, the adaptable range of the heat process temperature is spread, and it is easy to control manufacturing.

The high temperature holding time for the body to be processed is, preferably, within a range of 30 minutes to 50 hours, more preferably, within a range of 1 hour to 40 hours, furthermore preferably, within a range of 3 hours to 30 hours, and particularly preferably, within a range of 2 hours to 25 hours. When the holding time of the body to be processed is less than 30 minutes, there is a possibility that the electrically conductive mayenite compound with a sufficient high electron density cannot be obtained and sintering is not sufficient so that the obtained sintered body may be easily broken. Further, even when the holding time becomes longer, there is no problem in its characteristics; however, it is preferable that the holding time is less than or equal to 50 hours so that a desired shape of the mayenite compound can be easily held. It is more preferable that the holding time is less than or equal to 40 hours in a viewpoint of not wasting energy.

With the above steps, the electrically conductive mayenite compound with an electron density of greater than or equal to $3 \times 10^{20}$ cm$^{-3}$ can be manufactured. Here, when the body to be processed including the fluorine component is used in step S110, the electrically conductive mayenite compound with a high electron density including fluorine is manufactured. In this case, fluorine may be introduced into a cage or may be introduced into a framework of the cages.

Figure 2:
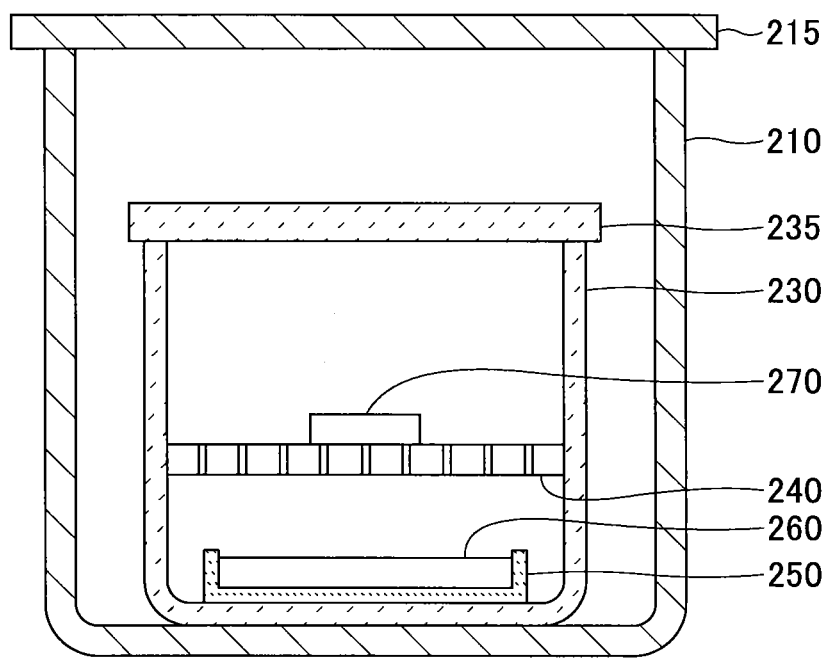
FIG. 2 is a view schematically illustrating an example of a structure of an apparatus that is used when performing a heat treatment on a body to be processed.

FIG. 2 schematically illustrates an example of a structure of an apparatus 200 that is used when performing the heat treatment on the body to be processed.

The apparatus 200 includes a carbon container 210 whose upper portion is opened, a carbon cover 215 placed on an upper portion of the carbon container 210, and an alumina container 230 with an alumina cover 235 placed in the carbon container 210.

A partition plate 240 and a heat-resisting tray 250 (alumina tray, for example) are placed in the alumina container 230. An aluminum compound 260, in a form of a powder, for example, is provided in the heat-resisting tray 250. The aluminum compound 260 is a compound that generates aluminum oxide gas when the apparatus 200 becomes a high temperature and is aluminum carbide ($Al_4C_3$), for example.

The partition plate 240 is used for placing the body to be processed 270 at its upper portion. For example, the partition plate 240 may be an alumina plate or the like provided with a lot of through-holes.

The partition plate 240 is not an essential component and may be omitted. In such a case, the body to be processed 270 is directly placed on the aluminum compound 260. Alternatively, when the aluminum compound 260 is in a form of a powder, the body to be processed 270 may be embedded in the aluminum compound 260.

The carbon container 210 and the carbon cover 215 become a supply source of carbon monoxide gas when performing the heat treatment on the body to be processed 270.

The entirety of the apparatus 200 is contained in a heat-resisting closed container, and the heat-resisting closed container is connected to an exhaust system. Thus, the heat-resisting closed container and further, the carbon container 210 can be controlled to a desired reduced pressure (vacuum) environment.

Hereinafter, a method of manufacturing an electrically conductive mayenite compound with a high electron density using the apparatus 200 is explained by using an example in which the body to be processed 270 is formed by a compact body of a mayenite compound powder.

First, the entirety of the apparatus 200 is controlled to be in a predetermined reducing environment.

Next, the body to be processed 270 is held at a temperature of 1080° C. to 1450° C. using the apparatus 200.

At this time, carbon monoxide gas is generated from the carbon container 210 and the carbon cover 215, and as illustrated in equations (2) and (3), aluminum oxide gas is generated from the aluminum compound 260. Thus, the body to be processed 270 is exposed to a strong reducing atmosphere.

$$Al_4C_3 + 2O_2 \rightarrow 4AlO + 3C \qquad (2)$$

$$Al_4C_3 + O_2 \rightarrow 2Al_2O + 3C \qquad (3)$$

Thus, free oxygen ions included in cages of the mayenite compound of the body to be processed 270 are reduced by the aluminum oxide gas by reactions as illustrated in formulas (4) and (5).

$$2AlO + O^{2-}(\text{cage}) \rightarrow Al_2O_3 + 2e^-(\text{cage}) \qquad (4)$$

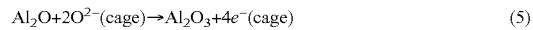

$$Al_2O + 2O^{2-}(\text{cage}) \rightarrow Al_2O_3 + 4e^-(\text{cage}) \qquad (5)$$

With this, after the heat treatment, an electrically conductive mayenite compound with a high electron density is generated from the body to be processed 270.

Further, when the body to be processed 270 is a compact body of the calcinated powder, an electrically conductive mayenite compound with a high electron density can be manufactured using the apparatus 200 as well.

Here, at this time, the body to be processed 270 does not include a mayenite compound (almost) at all. However, when holding the body to be processed 270 at a temperature of 1230° C. to 1415° C., calcium oxide, aluminum oxide and calcium aluminate included in the calcinated powder react with each other to generate a non-electrically conductive mayenite compound.

While holding the body to be processed 270 at a high temperature, carbon monoxide gas is generated from the carbon container 210 and the carbon cover 215, and aluminum oxide gas is generated from the aluminum compound 260. Thus, it can be considered that free oxygen ions included in cages of the generated non-electrically conductive mayenite compound are rapidly substituted for by electrons. With this, an electrically conductive mayenite compound with a high electron density is generated. Thereafter, similar to a process of sintering general ceramics particles, the powders of the generated electrically conductive mayenite compound with a high electron density are sintered and a sintered body of the electrically conductive mayenite compound with a high electron density is formed.

Thus, by holding the body to be processed 270 at a high temperature, an electrically conductive mayenite compound with a high electron density can be generated and sintered directly from the calcinated powder.

Here, the apparatus structure illustrated in FIG. 2 is just an example, and it should be apparent for those skilled in the art to perform the heat treatment on the body to be processed using other apparatuses.

As described above, according to the method of manufacturing of the embodiment of the present invention, metal aluminum is not used when performing the heat treatment. Thus, according to the method of manufacturing of the embodiment of the present invention, it is significantly prevented that an adhered body such as metal aluminum or the like adheres to the surface of the generated electrically conductive mayenite compound with a high electron density. Thus, according to the method of manufacturing of the embodiment of the present invention, the electrically conductive mayenite compound with a high electron density that is generated after performing the heat treatment can be relatively easily collected.

(Target for Film Deposition Made of Example of Electrically Conductive Mayenite Compound with High Electron Density of Embodiment)

When the example of the method of manufacturing of the embodiment is used, for example, a target (sputtering target, for example) that is used in depositing a film by a vapor deposition method can be manufactured. This target is structured by the electrically conductive mayenite compound with a high electron density.

As described above, according to the method described in Patent Document 2, the body to be processed is soaked in melted aluminum generated by aluminum particles that are melted when performing the heat treatment. Thus, a problem occurs that an adhered body of aluminum strongly bonds to a surface of the body to be processed after the heat treatment.

Further, as such an adhered body is fixed to the container used in the heat treatment, it is difficult to collect the body to be processed without damaging the body to be processed. In particular, when the size of the body to be processed is large, it is extremely difficult to collect the body to be processed without damaging it.

With such a problem, it has been difficult to manufacture a large size product structured by an electrically conductive mayenite compound with a high electron density, such as a target whose minimum size is greater than or equal to 5 mm, so far.

However, according to an embodiment of the present invention, a film deposition target including the electrically conductive mayenite compound whose electron density is greater than or equal to $3 \times 10^{20}$ cm$^{-3}$ and whose minimum size is greater than or equal to 5 mm can be easily manufactured. A disk flat target whose diameter is preferably greater than or equal to 50 mm, more preferably, greater than or equal to 75 mm, furthermore preferably, greater than or equal to 100 mm, and particularly preferably, greater than or equal to 200 mm may be manufactured. A rectangular flat target whose length is preferably greater than or equal to 50 mm, more preferably, greater than or equal to 75 mm, furthermore preferably, greater than or equal to 100 mm, and particularly preferably, greater than or equal to 200 mm may be manufactured. A cylindrical target whose height of cylinder is preferably greater than or equal to 50 mm, more preferably, greater than or equal to 75 mm, furthermore preferably, greater than or equal to 100 mm, and particularly preferably, greater than or equal to 200 mm may be manufactured.

It is preferable that the electron density or the relative density of the film deposition target is higher. It is preferable that the electron density is greater than or equal to $5.0 \times 10^{20}$ cm$^{-3}$, more preferably, greater than or equal to $1.0 \times 10^{21}$ cm$^{-3}$, furthermore preferably, greater than or equal to $1.3 \times 10^{21}$ cm$^{-3}$, and particularly preferably, greater than or equal to $1.5 \times 10^{21}$ cm$^{-3}$. It is preferable that the relative density is greater than or equal to 90%, furthermore preferably, greater than or equal to 93%, and particularly preferably, greater than or equal to 95%.

When forming a thin film on a substrate using a film deposition target of the embodiment by a vapor deposition method under an atmosphere in which partial pressure of oxygen is less than 0.1 Pa, an amorphous thin film including electrons can be formed. An amorphous thin film including electrons within a range of the electron density greater than or equal to $2 \times 10^{16}$ cm$^{-3}$ and less than or equal to $2.3 \times 10^{21}$ cm$^{-3}$ can be obtained. The amorphous thin film may be formed by an amorphous solid material including calcium, aluminum and oxygen. In other words, when forming a thin film on a substrate using a film deposition target of the embodiment by a vapor deposition method under an atmosphere in which partial pressure of oxygen is less than 0.1 Pa 0.1 Pa, an amorphous oxide electride thin film including calcium and aluminum may be formed.

The obtained amorphous thin film absorbs light at a photon energy level of 4.6 eV. The electron density of the obtained amorphous thin film may be greater than or equal to $1 \times 10^{19}$ cm$^{-3}$ or may be greater than or equal to $1 \times 10^{20}$ cm$^{-3}$. The work function of the obtained amorphous thin film may be 2.8 to 3.2 eV. The ratio of the optical absorption coefficient at a photon energy level of 4.6 eV with respect to the optical absorption coefficient at a photon energy level of 3.3 eV of the obtained amorphous thin film may be less than or equal to 0.35. The concentration of F$^+$ center of the obtained amorphous thin film may be less than $5 \times 10^{18}$ cm$^{-3}$.

A thin film as an electron injection layer of an organic EL element may be formed by using the film deposition target of the embodiment.

EXAMPLES

Next, examples of the embodiment are explained. Examples 1 to 12 and 21 to 32 are working examples of the embodiment and Examples 51 to 55 are relative examples.

Example 1

The electrically conductive mayenite compound with a high electron density was manufactured by the following method.

(Syntheses of Mayenite Compound)

First, 313.5 g of a calcium carbonate powder (CaCO$_3$, manufactured by KANTO CHEMICAL Co., Inc., special grade) and 186.5 g of an aluminum oxide powder ($\alpha$-Al$_2$O$_3$, manufactured by KANTO CHEMICAL Co., Inc., special grade) were mixed such that calcium oxide (CaO):aluminum oxide (Al$_2$O$_3$) became 12:7 by molar ratio conversion. Next, the mixed powder was heated in air to 1350° C. at a temperature rising rate of 300° C./hour, and held at 1350° C. for 6 hours. Thereafter, the mixed powder was cooled at a cooling rate of 300° C./hour to obtain about 362 g of a white block body.

Next, after grinding the white block body by an alumina stamping mill to be flakes of about 5 mm, further, the flakes were roughly ground by an alumina automatic mortar mill to obtain a white particles A1. By measuring the granularity of the obtained white particles A1 by a laser diffraction/scattering method (SALD-2100, manufactured by Shimadzu Corporation), the average particle size of the obtained white particle A1 was 20 μm.

Next, 300 g of the white particle A1, 3 kg of zirconia balls having a diameter of 5 mm, and 800 ml of industrial EL grade isopropyl alcohol as a milling solvent were put in a 7 liter zirconia container, and milled with a ball mill milling process at a rotation speed of 72 rpm for 16 hours after placing a zirconia cover on the container.

After the process, the obtained slurry was filtered under suction to remove the milling solvent. The remaining material was put into an oven at 80° C. and dried for 10 hours. With this, a white powder B1 was obtained. As a result of X-ray diffraction analysis, it was confirmed that the obtained white powder B1 had the C12A7 structure. By the above described laser diffraction/scattering method, it was revealed that the average particle size of the obtained white powder B1 was 1.5 µm.

(Manufacturing Compact Body of Mayenite Compound Powder)

The powder B1 (7 g) obtained by the above described method was spread in a mold having a length of 40 mm and a width of 20 mm and a height of 30 mm. The molding was performed with a uni-axial press at a pressure of 10 MPa for 1 minute. Further, the molding was performed with a cold isostatic pressing at a pressure of 180 MPa to obtain a compact body C1 having a length of about 40 mm and a width of about 20 mm and a height of about 10 mm. The compact body C1 was cut into a rectangular solid shape with a length of 10 mm and a width of 8 mm and a thickness of 6 mm by a commercially available cutter to be used as a body to be processed.

(Manufacturing Electrically Conductive Mayenite Compound)

Next, the object to be processed underwent a heat treatment at a high temperature and the electrically conductive mayenite compound with a high electron density was manufactured.

Figure 3:
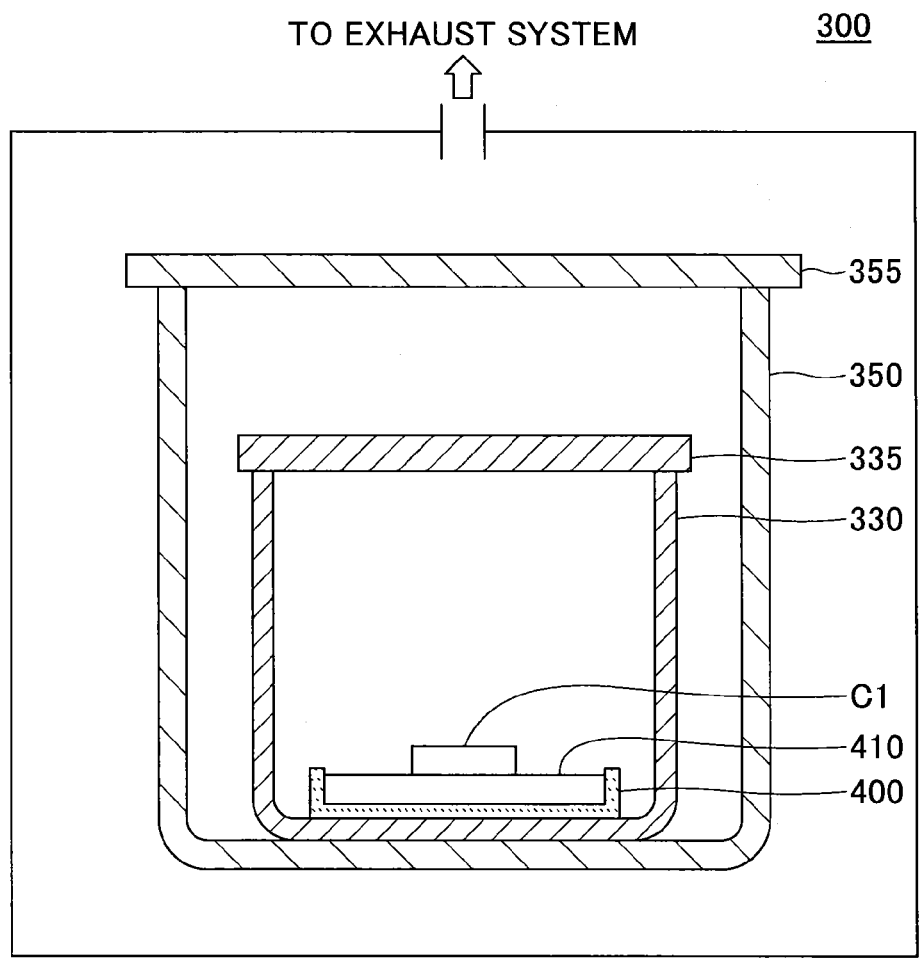
FIG. 3 is a view schematically illustrating an example of a structure of an apparatus that was used when performing a heat treatment on an object to be processed of Example 1.

For the heat treatment of the body to be processed, an apparatus 300 as illustrated in FIG. 3 was used. As illustrated in FIG. 3, the apparatus 300 includes a first carbon container 330 with a carbon cover 335 and a second carbon container 350 with a carbon cover 355. The first carbon container 330 is contained in the second carbon container 350.

The first carbon container 330 has a substantially cylindrical shape whose external diameter is 60 mm and internal diameter is 50 mm and height is 60 mm. The second carbon container 350 has a substantially cylindrical shape whose external diameter is 80 mm and internal diameter is 70 mm and height is 75 mm.

The apparatus 300 includes an alumina container 400 placed in the first carbon container 330 and 3 g of an aluminum carbide powder 410 (manufactured by The Nilaco Corporation) were placed in the alumina container 400. The body to be processed was directly placed on the aluminum carbide powder 410.

Next, the entirety of the apparatus 300 configured as such was provided in an atmosphere adjustable electric furnace. The electric furnace was evacuated by a rotary pump and a mechanical booster pump. With this, the pressure in the electric furnace was reduced to about 20 Pa.

Next, the heat treatment was performed by heating the apparatus 300. The heat treatment was performed by heating the apparatus 300 to 1300° C. at a temperature rising rate of 300° C./hour, holding at this temperature for 6 hours, and cooling the apparatus 300 to a room temperature at a decreasing rate of 300° C./hour.

After this heat treatment, a black material D1 whose surface was black was obtained.

Although the aluminum carbide powder 410 was altered to black, it was not sintered. Thus, the black material D1 could easily be separated from the aluminum carbide powder 410 and could be easily collected. Here, the relative density of the black material D1 was 97.8%.

(Evaluation)

Next, a sample for measuring electron density was extracted from the black material D1. The sample was obtained by roughly grinding the black material D1 using the alumina automatic mortar mill, and extracting a portion of the black material D1 corresponding to a center portion from the obtained rough particles.

The obtained sample was dark brown. As a result of the X-ray diffraction analysis, it was revealed that the sample only included the C12A7 structure. Further, the electron density obtained based on a position of peak of a light diffusion reflection spectrum of the obtained powder was $8.3 \times 10^{20}$ cm$^{-3}$.

With this, it was confirmed that the black material D1 was a sintered body of an electrically conductive mayenite compound with a high electron density.

Example 2

Similar to the above described method of Example 1, the electrically conductive mayenite compound with a high electron density was manufactured. However, in the step of (manufacturing electrically conductive mayenite compound), the heat process temperature of the compact body was 1340° C.

With this, a black material whose surface was black was obtained. The aluminum carbide powder was not sintered. Thus, the black material could easily be collected.

Example 3

Similar to the above described method of Example 1, the electrically conductive mayenite compound with a high electron density was manufactured. However, in the step of (manufacturing electrically conductive mayenite compound), the heat process temperature was 1250° C.

With this, a black material whose surface was black was obtained. The aluminum carbide powder was not sintered. Thus, the black material could easily be collected.

Example 4

Similar to the above described method of Example 1, the electrically conductive mayenite compound with a high electron density was manufactured. However, in the step of (manufacturing electrically conductive mayenite compound), the heat treatment time was 24 hours.

With this, a black material whose surface was black was obtained. The aluminum carbide powder was not sintered. Thus, the black material could easily be collected.

Example 5

Similar to the above described method of Example 1, the electrically conductive mayenite compound with a high electron density was manufactured. However, in the step of (manufacturing electrically conductive mayenite compound), the heat treatment time was 2 hours.

With this, after the above described step of (Manufacturing electrically conductive mayenite compound), a black material whose surface was black was obtained. The aluminum carbide powder was not sintered. Thus, the black material could easily be collected.

Example 6

Similar to the above described method of Example 1, the electrically conductive mayenite compound with a high electron density was manufactured. However, in the step of (manufacturing electrically conductive mayenite compound), the heat treatment was performed under a state in which the aluminum carbide powder and the body to be processed did not directly contact each other due to placing a partition plate like the partition plate 240 illustrated in FIG. 2 in the first carbon container 330.

With this, a black material whose surface was black was obtained. The black material could easily be collected.

Example 7

Similar to the above described method of Example 1, the electrically conductive mayenite compound with a high electron density was manufactured. However, for the powder of the compact body, an electrically conductive mayenite compound powder whose electron density was $5.0 \times 10^{19}$ $cm^{-3}$ was used.

The electrically conductive mayenite compound powder was prepared as follows.

The compact body C1 of Example 1 was provided in a container with an alumina cover, and a heat treatment was performed.

The heat treatment atmosphere was nitrogen. The heat treatment was performed by heating the compact body C1 to 1300° C. at a temperature rising rate of 300° C./hour and holding the compact body C1 at 1300° C. for 6 hours. Thereafter, the compact body C1 was cooled at a cooling rate of 300° C./hour to obtain a black block body.

Next, the obtained black block body was ground to obtain a powder whose average particle size was 1.4 μm. At this time, the same milling method similar to the method described at (Syntheses of mayenite compound) of Example 1 (that is, rough grinding by an alumina stamping mill, and a subsequent ball mill milling process using zirconia balls) was performed.

As a result of analysis, the obtained powder had the C12A7 structure and the electron density of which was $5.0 \times 10^{19}$ $cm^{-3}$.

The electrically conductive mayenite compound with a high electron density was manufactured by manufacturing conditions similar to those of Example 1 except that the compact body was manufactured using the electrically conductive mayenite compound powder.

With this, a black material whose surface was black was obtained. The aluminum carbide powder was not sintered. Thus, the black material could easily be collected.

Example 8

Similar to the above described method of Example 1, the electrically conductive mayenite compound with a high electron density was manufactured. However, in the step of (manufacturing electrically conductive mayenite compound), the pressure was 50 Pa.

With this, a black material whose surface was black was obtained. The aluminum carbide powder was not sintered. Thus, the black material could easily be collected.

Example 9

Similar to the above described method of Example 1, the electrically conductive mayenite compound with a high electron density was manufactured.

However, a sintered body of a (non-electrically conductive) mayenite compound was used as the body to be processed. Further, in the step of (manufacturing electrically conductive mayenite compound) of Example 1, the heat treatment time was 24 hours. The sintered body of the mayenite compound was manufactured as follows.

The compact body C1 obtained by the above described step of (Manufacturing compact body of mayenite compound powder) of Example 1 was placed on the alumina plate and heated to 1100° C. in air. The temperature rising rate was 300° C./hour. Next, after holding the compact body C1 at 1100° C. for 2 hours, the compact body C1 was cooled to a room temperature at a decreasing rate of 300° C./hour.

With this, a sintered body of the non-electrically conductive mayenite compound E9 was obtained. Here, the open porosity of the sintered body E9 was 31%. The obtained sintered body E9 was processed into a rectangular solid having a length of 8 mm and a width of 6 mm and a thickness of 6 mm and was used as the body to be processed.

With this, a black material whose surface was black was obtained. The aluminum carbide powder was not sintered. Thus, the black material could easily be collected.

Example 10

Similar to the above described method of Example 1, an electrically conductive mayenite compound was manufactured.

However, a sintered body of a (non-electrically conductive) mayenite compound was used as the body to be processed. Further, in the step of (manufacturing electrically conductive mayenite compound) of Example 1, the heat treatment time was 24 hours. The sintered body of the mayenite compound was manufactured as follows.

The compact body C1 obtained by the above described step of (Manufacturing compact body of mayenite compound powder) of Example 1 was placed on the alumina plate and heated to 1300 C. in air. The temperature rising rate was 300 C./hour. Next, after holding the compact body C1 at 1300° C. for 6 hours, the compact body C1 was cooled to a room temperature at a decreasing rate of 300 C./hour.

With this, a sintered body of the non-electrically conductive mayenite compound E10 was obtained. Here, the open porosity of the sintered body E10 was almost 0%. The obtained sintered body E10 was processed into a rectangular solid having a length of 8 mm and a width of 6 mm and a thickness of 6 mm and was used as the body to be processed.

With this, a black material whose surface was black was obtained. The aluminum carbide powder was not sintered. Thus, the black material could easily be collected.

Example 11

Similar to the above described method of Example 1, the electrically conductive mayenite compound with a high electron density was manufactured. However, in the step of (manufacturing electrically conductive mayenite compound), the aluminum carbide powder used in Example 1 was used again. The aluminum carbide powder was black after being used in Example 1.

With this, a black material whose surface was black was obtained. The aluminum carbide powder was not sintered. Thus, the black material could easily be collected. With this result, it was revealed that the aluminum carbide powder can be recycled.

Example 12

Similar to the above described method of Example 1, the electrically conductive mayenite compound with a high electron density was manufactured. However, a plate compact body with a length of 55 mm and a width of 55 mm and a thickness of 5 mm was used as the body to be processed. Further, the sizes of the carbon container and the alumina container of Example 1 in the step of (manufacturing electrically conductive mayenite compound) were changed. The compact body was manufactured as follows.

A granulated powder was previously manufactured by mixing the mayenite compound powder and a vehicle at a weight ratio of 10:1.5 by an automatic mortar. At this time, the vehicle was liquid obtained by dissolving polyvinyl butyral (BM-S, manufactured by SEKISUI CHEMICAL CO., LTD.) in organic solvent at 10 weight % as a solid content. The organic solvent was a mixture of toluene, isopropyl alcohol and butanol at a weight ratio of 6:3:1. The polyvinyl butyral also has a function as a binder that increases firmness of the compact body. 22 g of the granulated powder was spread in a mold having a length of 60 mm and a width of 60 mm and a height of 50 mm and performed with a uni-axial press at a pressure of 10 MPa for 1 minute. The compact body was dried in an oven at 80° C. for an hour to volatilize the solvent in the obtained compact body. Further, the molding was performed with a cold isostatic pressing (CIP) at a pressure of 180 MPa for a minute to obtain a plate compact body having a size of a length of 55 mm and a width of 55 mm and a thickness of 5 mm. This compact body was used as the body to be processed.

With this, a black material whose surface was black was obtained. The black material could easily be collected.

As a result of the X-ray diffraction analysis, it was revealed that the black material of each of Examples 2 to 12 collected by a method similar to that of Example 1 only included the C12A7 structure. The relative density and the electron density of the black material of each of Examples 2 to 12 are illustrated in Table 1. With the above fact, it was confirmed that the black material of each of Examples 2 to 12 was a sintered body of the mayenite compound with a high electron density.

Example 21

Similar to the above described method of Example 1, the electrically conductive mayenite compound was manufactured. However, in the step of (Manufacturing compact body of mayenite compound powder), the compact body was prepared using a mixed powder including a fluorine component instead of the powder B1 and the electrically conductive mayenite compound with a high electron density including fluorine was finally manufactured.

(Method of Preparing Compact Body)

First, 0.73 g of a calcium fluoride powder (CaF$_2$, manufactured by KANTO CHEMICAL Co., Inc., special grade) and 0.55 g of an aluminum oxide powder (α-Al$_2$O$_3$, manufactured by KANTO CHEMICAL Co., Inc., special grade) were added to 38.72 g of the powder B1 obtained by the method described at (Syntheses of mayenite compound) of Example 1, and then sufficiently mixed to obtain a mixed powder F21.

When it is assumed that the composition ratio of Ca/Al/F of the mixed powder F21 is maintained in a finally manufactured mayenite compound, the manufactured mayenite compound is expressed by a chemical formula as follows. In particular, x=0.32.

$$(12-x)CaO.7Al_2O_3.xCaF_2 \quad (6)$$

Next, 7 g of the mixed powder F21 were spread in a mold having a length of 40 mm and a width of 20 mm and a height of 30 mm. The molding was performed with a uni-axial press at a pressure of 10 MPa for 1 minute. Further, the molding was performed with a cold isostatic pressing at a pressure of 180 MPa. With this, a compact body C21 having a length of about 38 mm and a width of about 19 mm and a height of about 6 mm was formed.

Next, the compact body C21 was cut into a rectangular solid shape having a length of 19 mm and a width of 8 mm and a thickness of 6 mm by a commercially available cutter to be used as a body to be processed.

With this, a black material D21 whose surface was black was obtained. The aluminum carbide powder was not sintered. Thus, the black material D21 could easily be collected. The relative density of the black material D21 was 98.1%.

As a result of the X-ray diffraction analysis by a method similar to that of Example 1, the collected black material D21 of the sample only included the C12A7 structure. The electron density of the black material D21 was $1.1\times10^{21}$ cm$^{-3}$.

Next, as a result of measuring the lattice constant of the black material D21, the lattice constant of the black material D21 was smaller than the value of the black material of Example 1. With this, it is considered that the mayenite compound includes fluorine.

Next, the black material D21 was broken and a composition analysis of the broken surface was conducted by an energy-dispersive X-ray analysis (EDX). It was revealed by the analysis that the detected ratio of fluorine was close to the mixture ratio of the mixed powder F21.

As such, it was confirmed that the black material D21 was a sintered body of an electrically conductive mayenite compound with a high electron density including fluorine.

Example 22

Similar to the above described method of Example 21, the electrically conductive mayenite compound with a high electron density was manufactured. However, in the step of (manufacturing electrically conductive mayenite compound), the heat process temperature of the body to be processed was 1100° C.

With this, a black material whose surface was black was obtained. The aluminum carbide powder was not sintered. Thus, the black material could easily be collected.

Example 23

Similar to the above described method of Example 21, the electrically conductive mayenite compound with a high electron density was manufactured. However, in the step of (manufacturing electrically conductive mayenite compound), the heat process temperature of the body to be processed was 1380° C.

With this, a black material whose surface was black was obtained. The aluminum carbide powder was not sintered. Thus, the black material could easily be collected.

Example 24

Similar to the above described method of Example 21, the electrically conductive mayenite compound with a high electron density was manufactured. However, in the step of (Method of preparing compact body), 1.07 g of a calcium fluoride powder (CaF$_2$, manufactured by KANTO CHEMICAL Co., Inc., special grade) and 0.82 g of an aluminum oxide powder (α-Al$_2$O$_3$, manufactured by KANTO CHEMICAL Co., Inc., special grade) were added to 38.11 g of the powder B1, and then sufficiently mixed to obtain a mixed powder F24.

When it is assumed that the composition ration of Ca/Al/F of the mixed powder F24 is maintained in a finally manufactured mayenite compound, the manufactured mayenite compound is expressed by the above described chemical formula (6), and in particular, x=0.48.

Other than using the mixed powder F24 instead of the mixed powder F21 of Example 21, the body to be processed was obtained by a method similar to that in Example 21 and was used. Here, the heat process temperature of the body to be processed was 1420° C.

With this, a black material whose surface was black was obtained. The aluminum carbide powder was not sintered. Thus, the black material could easily be collected.

Example 25

Similar to the above described method of Example 21, the electrically conductive mayenite compound with a high electron density was manufactured. However, in the step of (Method of preparing compact body), 0.12 g of a calcium fluoride powder ($CaF_2$, manufactured by KANTO CHEMICAL Co., Inc., special grade) and 0.09 g of an aluminum oxide powder ($\alpha$-$Al_2O_3$, manufactured by KANTO CHEMICAL Co., Inc., special grade) were added to 39.78 g of the powder B1, and then sufficiently mixed to obtain a mixed powder F25.

When it is assumed that the composition ratio of Ca/Al/F of the mixed powder F25 is maintained in a finally manufactured mayenite compound, the manufactured mayenite compound is expressed by the above described chemical formula (6), and in particular, x=0.06. Other than using the mixed powder F25 instead of the mixed powder F21 of Example 21, the body to be processed was obtained by a method similar to that in Example 21 and was used.

With this, a black material whose surface was black was obtained. The aluminum carbide powder was not sintered. Thus, the black material could easily be collected.

Example 26

Similar to the above described method of Example 1, the electrically conductive mayenite compound with a high electron density was manufactured.

However, a sintered body of (non-electrically conductive) mayenite compound including fluorine was used as the body to be processed.

The sintered body of the mayenite compound including fluorine was manufactured as follows.

The compact body C21 obtained by the above described step of (Method of preparing compact body) of Example 21 was placed on the alumina plate and heated to 1400° C. in air. The temperature rising rate was 300° C./hour. Next, after holding the compact body C21 at 1400° C. for 6 hours, the compact body C21 was cooled to a room temperature at a decreasing rate of 300° C./hour.

With this, a sintered body E26 was obtained. Here, the open porosity of the sintered body E26 was almost 0%. The obtained sintered body E26 was processed into a rectangular solid having a length of 8 mm and a width of 6 mm and a thickness of 6 mm and was used as the body to be processed.

With this, after the above described step of (Manufacturing electrically conductive mayenite compound) of Example 1, a black material whose surface was black was obtained. The aluminum carbide powder was not sintered. Thus, the black material could easily be collected.

As a result of the X-ray diffraction analysis of each of Examples 22 to 26, similar to the above described method of Example 1, it was revealed that that the black material of the collected sample only included the C12A7 structure. As a result of measuring the lattice constant of the black material, the lattice constant of the black material was smaller than a value of the black material D1 of Example 1. It can be considered that the mayenite compound includes fluorine. Further, the black material was broken and a composition analysis of the broken surface was conducted. It was revealed by the analysis that the detected ratio of fluorine was close to the mixture ratio of the mixed powder used as a source material. Further, the relative density and the electron density of the black material of each of Examples 22 to 26 are illustrated in Table 2. With this, it was confirmed that the black material of each of Examples 22 to 26 was a sintered body of an electrically conductive mayenite compound with a high electron density.

Example 27

Similar to the above described method of Example 1, the electrically conductive mayenite compound with a high electron density was manufactured.

However, a compact body of a calcinated powder was used as the body to be processed. The compact body of a calcinated powder was manufactured as follows.
(Syntheses of Calcinated Powder)

First, 313.5 g of a calcium carbonate powder ($CaCO_3$, manufactured by KANTO CHEMICAL Co., Inc., special grade) and 186.5 g of an aluminum oxide powder ($\alpha$-$Al_2O_3$, manufactured by KANTO CHEMICAL Co., Inc., special grade) were mixed such that calcium oxide (CaO):aluminum oxide ($Al_2O_3$) became 12:7 by molar ratio conversion. Next, the mixed powder was heated in air to 1000° C. at temperature rising rate of 300° C./hour, and held at 1000° C. for 6 hours. Thereafter, the mixed powder was cooled at a cooling rate of 300° C./hour.

With this, about 362 g of a white powder was obtained. The white powder could be easily crushed by an automatic mortar.
(Manufacturing Compact Body of Calcinated Powder)

0.7 g of industrial EL grade isopropyl alcohol (IPA) was added to 7 g of the white powder and was mixed by an automatic mortar. Next, the mixture was spread in a mold having a length of 40 mm and a width of 20 mm and a height of 30 mm. The molding was performed with a uni-axial press at a pressure of 10 MPa for 1 minute. Further, the molding was performed with a cold isostatic pressing at a pressure of 180 MPa.

With this, a compact body C27 having a length of about 38 mm and a width of about 19 mm and a height of about 6 mm was obtained. Here, IPA functions as a binder of the compact body. The compact body C27 was cut into a rectangular solid shape having a length of 19 mm and a width of 8 mm and a thickness of 6 mm by a commercially available cutter to be used as a body to be processed.

Next, using the body to be processed, which is the compact body of the calcinated powder, the step of (Manufacturing electrically conductive mayenite compound) of Example 1 was performed. However, in the above described step of (Manufacturing electrically conductive mayenite compound), the heat treatment time was 12 hours.

With this, a black material D27 was obtained. The black material D27 could easily be collected.

The relative density of the black material D27 was 89.5%.

As a result of the X-ray diffraction analysis of the collected sample similar to the above described method of Example 1, it was revealed that the black material D27 only included the C12A7 structure. The electron density of the black material D27 was $8.8 \times 10^{20}$ cm$^{-3}$.

With this, it was confirmed that the black material D27 was a sintered body of the electrically conductive mayenite compound with a high electron density.

Example 28

Similar to the above described method of Example 27, the electrically conductive mayenite compound with high electron density was manufactured. However, in the step of (Manufacturing electrically conductive mayenite compound), the heat process temperature was 1250° C. and the heat treatment time was 12 hours.

With this, a black material was obtained. The black material could easily be collected.

Example 29

Similar to the above described method of Example 27, the electrically conductive mayenite compound with a high electron density was manufactured. However, in the step of (Manufacturing electrically conductive mayenite compound), the heat treatment time was 24 hours.

With this, a black material was obtained. The black material could easily be collected.

Example 30

Similar to the above described method of Example 27, the electrically conductive mayenite compound with a high electron density was manufactured. However, in the step of (Manufacturing electrically conductive mayenite compound), the heat treatment time was 2 hours.

With this, a black material was obtained. The black material could easily be collected.

Example 31

Similar to the above described method of Example 27, the electrically conductive mayenite compound with a high electron density was manufactured.

However, in the step of (Manufacturing electrically conductive mayenite compound), the heat treatment was performed under a state in which the aluminum carbide powder and the compact body C27 did not directly contact each other due to placing a partition plate like the partition plate 240 illustrated in FIG. 2 in the first carbon container 330.

With this, a black material was obtained. The black material could easily be collected.

Example 32

Similar to the above described method of Example 27, the electrically conductive mayenite compound with a high electron density was manufactured. However, in the step of (Manufacturing electrically conductive mayenite compound), the pressure at a vacuum atmosphere was 50 Pa.

With this, a black material was obtained. The black material could easily be collected.

As a result of the X-ray diffraction analysis of each of Examples 28 to 32, similar to the above described method of Example 1, it was revealed that the black material of the collected sample only included the C12A7 structure. The relative density and the electron density of the black material of each of Examples 28 to 32 are illustrated in Table 2. With this, it was confirmed that the black material of each of Examples 28 to 32 was a sintered body of an electrically conductive mayenite compound with a high electron density.

Example 51

Similar to the above described method of Example 21, manufacturing of an electrically conductive mayenite compound with a high electron density was tried. However, in the step of (Manufacturing electrically conductive mayenite compound), the heat process temperature was 1460° C.

With this, after the above described step of (Manufacturing electrically conductive mayenite compound), a black material D51 whose surface was black was obtained. The black material D51 was extremely deformed. The black material D51 was gassed and it was difficult to measure the relative density.

Further, as a result of the X-ray diffraction analysis of a powder obtained by grinding the black material D51 similar to the above described method of Example 1, it was revealed that the black material D51 only included the C12A7 structure. However, the electron density of the black material D51 was $5.8 \times 10^{19}$ cm$^{-3}$.

With this, it was confirmed that the black material D51 was not the electrically conductive mayenite compound with a high electron density.

Example 52

Similar to the above described method of Example 21, manufacturing of an electrically conductive mayenite compound with a high electron density was tried. However, in the step of (Manufacturing electrically conductive mayenite compound), the heat process temperature was 1050° C.

With this, after the above described step of (Manufacturing electrically conductive mayenite compound), a black material D52 whose surface was dingy was obtained.

Further, as a result of the X-ray diffraction analysis of a powder obtained by grinding the black material D52 similar to the above described method of Example 1, it was revealed that the black material D52 only included the C12A7 structure. However, the electron density of the black material D52 was $2.5 \times 10^{19}$ cm$^{-3}$.

With this, it was confirmed that the black material D52 was not the electrically conductive mayenite compound with a high electron density.

Example 53

Similar to the above described method of Example 1, manufacturing of an electrically conductive mayenite compound with a high electron density was tried. However, the heat treatment of the body to be processed was performed under an environment where CO gas did not exist.

More specifically, for the apparatus 300 used in the step of (Manufacturing electrically conductive mayenite compound) of Example, the first carbon container 330, the second carbon container 350 and the carbon covers 335 and 355 were all exchanged by those made of alumina. Further, the pressure at a vacuum atmosphere at the heat treatment was 50 Pa.

With this, after the above described step of (Manufacturing electrically conductive mayenite compound), a black material D53 whose surface was dingy was obtained.

As a result of the X-ray diffraction analysis of a powder obtained by grinding the black material D53 similar to the above described method of Example 1, it was revealed that the black material D53 did not have a single phase of the C12A7 structure.

With this, it was confirmed that the black material D53 was not a high purity electrically conductive mayenite compound.

Example 54

Similar to the above described method of Example 1, manufacturing of an electrically conductive mayenite compound with a high electron density was tried. However, the heat treatment of the body to be processed was performed under an environment where aluminum oxide gas did not exist.

More specifically, for the apparatus 300 used in the step of (Manufacturing electrically conductive mayenite compound) of Example 1, the aluminum carbide powder 410 (manufactured by The Nilaco Corporation) was not placed in the alumina container 400. The body to be processed was directly placed in the alumina container 400.

When performing the heat treatment, the apparatus 300 was evacuated to 100 Pa, and then, nitrogen gas, in which the oxygen concentration was less than or equal to 1 ppm, was introduced to the apparatus 300 to become atmospheric pressure. Thus, the pressure at the heat treatment was atmospheric pressure.

With this, after the above described step of (Manufacturing electrically conductive mayenite compound), a black material D54 whose surface was dingy was obtained.

As a result of the X-ray diffraction analysis of a powder obtained by grinding the black material D54 similar to the above described method of Example 1, it was revealed that the black material D54 only included the C12A7 structure. The electron density of the black material D54 was $4.8 \times 10^{19}$ cm$^{-3}$.

With this, it was confirmed that the black material D54 was not the electrically conductive mayenite compound with a high electron density.

Example 55

Similar to the above described method of Example 1, manufacturing of an electrically conductive mayenite compound with a high electron density was tried. However, for the apparatus 300 used in the step of (Manufacturing electrically conductive mayenite compound), metal aluminum was placed in the alumina container 400 instead of the aluminum carbide powder 410 (manufactured by The Nilaco Corporation).

With this, after the above described step of (Manufacturing electrically conductive mayenite compound), a black material D55 was obtained. However, the black material D55 was half sunk in the aluminum layer, and much effort was necessary to collect the sample. Thus, it is considered that this method is not adaptable to industrial manufacturing.

Specifications, heat process conditions, evaluated results and the like of the body to be processed of Examples 1 to 12, Examples 21 to 32 and Examples 51 to 55 are illustrated in the following Tables 1 and 2.

TABLE 1

| EXAMPLE | BODY TO BE PROCESSED | HEAT TREATMENT TEMPERATURE (° C.) | HEAT TREATMENT PERIOD (h) | PRESSURE AT VACUUM ATMOSPHERE (Pa) | RELATIVE DENSITY (%) | ELECTRON DENSITY (cm$^{-3}$) |
|---|---|---|---|---|---|---|
| EXAMPLE 1 | (i) | 1300 | 6 | 20 | 97.8 | $8.3 \times 10^{20}$ |
| EXAMPLE 2 | (i) | 1340 | 6 | 20 | 98.0 | $8.5 \times 10^{20}$ |
| EXAMPLE 3 | (i) | 1250 | 6 | 20 | 95.8 | $8.1 \times 10^{20}$ |
| EXAMPLE 4 | (i) | 1300 | 24 | 20 | 98.0 | $1.1 \times 10^{21}$ |
| EXAMPLE 5 | (i) | 1300 | 2 | 20 | 98.0 | $9.2 \times 10^{20}$ |
| EXAMPLE 6 | (i) | 1300 | 6 | 20 | 98.0 | $7.1 \times 10^{20}$ |
| EXAMPLE 7 | (i) | 1300 | 6 | 20 | 98.0 | $8.4 \times 10^{20}$ |
| EXAMPLE 8 | (i) | 1300 | 6 | 50 | 97.9 | $9.0 \times 10^{20}$ |
| EXAMPLE 9 | (ii) | 1300 | 24 | 20 | 97.9 | $8.6 \times 10^{20}$ |
| EXAMPLE 10 | (ii) | 1300 | 24 | 20 | 93.0 | $8.5 \times 10^{20}$ |
| EXAMPLE 11 | (i) | 1300 | 6 | 20 | 98.0 | $8.8 \times 10^{20}$ |
| EXAMPLE 12 | (i) | 1300 | 6 | 20 | 97.5 | $8.5 \times 10^{20}$ |

TABLE 2

| EXAMPLE | BODY TO BE PROCESSED | F ADDITION AMOUNT (xVALUE) | HEAT TREATMENT TEMPERATURE (° C.) | HEAT TREATMENT PERIOD (h) | PRESSURE AT VACUUM ATMOSPHERE (Pa) | RELATIVE DENSITY (%) | ELECTRON DENSITY (cm$^{-3}$) |
|---|---|---|---|---|---|---|---|
| EXAMPLE 21 | (i) | 0.32 | 1300 | 6 | 20 | 98.1 | $1.1 \times 10^{21}$ |
| EXAMPLE 22 | (i) | 0.32 | 1100 | 6 | 20 | 92.6 | $1.0 \times 10^{21}$ |
| EXAMPLE 23 | (i) | 0.32 | 1380 | 6 | 20 | 98.0 | $1.0 \times 10^{21}$ |
| EXAMPLE 24 | (i) | 0.48 | 1420 | 6 | 20 | 95.0 | $9.0 \times 10^{20}$ |
| EXAMPLE 25 | (i) | 0.06 | 1300 | 6 | 20 | 97.2 | $9.2 \times 10^{20}$ |
| EXAMPLE 26 | (ii) | 0.32 | 1300 | 6 | 20 | 96.0 | $1.2 \times 10^{21}$ |
| EXAMPLE 27 | (iii) | — | 1300 | 12 | 20 | 89.5 | $8.8 \times 10^{20}$ |
| EXAMPLE 28 | (iii) | — | 1250 | 12 | 20 | 89.3 | $8.5 \times 10^{20}$ |
| EXAMPLE 29 | (iii) | — | 1300 | 24 | 20 | 92.6 | $6.0 \times 10^{20}$ |
| EXAMPLE 30 | (iii) | — | 1300 | 2 | 20 | 91.9 | $6.6 \times 10^{20}$ |
| EXAMPLE 31 | (iii) | — | 1300 | 6 | 20 | 98.0 | $7.1 \times 10^{20}$ |
| EXAMPLE 32 | (iii) | — | 1300 | 6 | 50 | 90.0 | $8.5 \times 10^{20}$ |
| EXAMPLE 51 | (i) | 0.32 | 1460 | 6 | 20 | — | $5.8 \times 10^{19}$ |

TABLE 2-continued

| EXAMPLE | BODY TO BE PROCESSED | F ADDITION AMOUNT (xVALUE) | HEAT TREATMENT TEMPERATURE (° C.) | HEAT TREATMENT PERIOD (h) | PRESSURE AT VACUUM ATMOSPHERE (Pa) | RELATIVE DENSITY (%) | ELECTRON DENSITY (cm$^{-3}$) |
|---|---|---|---|---|---|---|---|
| EXAMPLE 52 | (i) | 0.32 | 1050 | 6 | 20 | — | $2.5 \times 10^{19}$ |
| EXAMPLE 53 | (i) | — | 1300 | 6 | 50 | — | — |
| EXAMPLE 54 | (i) | — | 1300 | 6 | $1 \times 10^5$ (NITROGEN) | — | $4.8 \times 10^{19}$ |
| EXAMPLE 55 | (i) | — | 1300 | 6 | 20 | — | — |

In Tables 1 and 2, marks (i), (ii) and (iii) in the item "body to be processed" indicate that the body to be processed is the compact body of the mayenite compound, the body to be processed is the sintered body of the mayenite compound and the body to be processed is the calcinated powder, respectively.

Further, a value in the item "F addition amount (x value)" indicates the fluorine (F) amount included in the respective body to be processed. This value indicates a value of "x" when it is assumed that the mayenite compound expressed by the following equation (6) is finally manufactured from the body to be processed.

$$(12-x)\text{CaO} \cdot 7\text{Al}_2\text{O}_3 \cdot x\text{CaF}_2 \quad (6)$$

The present embodiment is adaptable for a method of manufacturing an electrically conductive mayenite compound with a high electron density that can be used for a sputtering target or the like necessary for forming an electrode of a fluorescent lamp, or a thin film of an electron injection layer of an organic EL element.

Although a preferred embodiment of the method of manufacturing an electrically conductive mayenite compound with a high electron density has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

What is claimed is:

1. A method of manufacturing an electrically conductive mayenite compound, comprising:
   (a) preparing a body to be processed, the body to be processed including a mayenite compound or a precursor of a mayenite compound; and
   (b) performing a heat treatment on the body to be processed under a reducing atmosphere including an aluminum compound and carbon monoxide (CO) gas within a range of 1080° C. to 1450° C., the aluminum compound being a compound that emits aluminim oxide gas during the heat treatment on the body to be processed and generates carbide at a surface of the body to be processed.

2. The method of manufacturing an electrically conductive mayenite compound according to claim 1, wherein the aluminum compound is aluminum carbide ($\text{Al}_4\text{C}_3$).

3. The method of manufacturing an electrically conductive mayenite compound according to claim 1, wherein the body to be processed is selected from the group consisting of a compact body comprising a mayenite compound powder, a sintered body comprising a mayenite compound, and a compact body comprising a calcinated powder comprising calcium and aluminum.

4. The method of manufacturing an electrically conductive mayenite compound according to claim 1, wherein (b) is performed within a range of 30 minutes to 50 hours.

5. The method of manufacturing an electrically conductive mayenite compound according to claim 1, wherein (b) is performed under a vacuum environment whose pressure is less than or equal to 100 Pa.

6. The method of manufacturing an electrically conductive mayenite compound according to claim 1, wherein (b) s performed under a state in which the body to be processed and the aluminum compound are contained in a container including carbon.

7. The method of manufacturing an electrically conductive mayenite compound according to claim 1, wherein an electrically conductive mayenite compound whose electron density is greater than or equal to $3 \times 10^{20}$ cm$^{-3}$ is obtained after (b).

8. The method of manufacturing an electrically conductive mayenite compound according to claim 1,
   wherein the body to be processed includes a fluorine (F) component, and
   wherein an electrically conductive mayenite compound including fluorine is obtained after (b).

9. The method of manufacturing an electrically conductive mayenite compound according to claim 1, wherein the electrically conductive mayenite compound is a target for depositing a film.

10. The method of claim 9, wherein said target has an electron density of at least $3 \times 10^{20}$ cm$^{-3}$ and a minimum size of at least 5 mm.

11. The method of claim 9, wherein said target is a disk flat target, a rectangular flat target, or a cylindrical target.

12. The method of claim 9, wherein said target is a disk flat target having a diameter of at least 50 mm.

13. The method of claim 9, wherein said target is a rectangular flat target having a length of at least 50 mm.

14. The method of claim 9, wherein said target is a cylindrical target having a height of at least 50 mm.

* * * * *